United States Patent
Park et al.

(10) Patent No.: US 9,036,419 B2
(45) Date of Patent: May 19, 2015

(54) 3D STACKED NAND FLASH MEMORY ARRAY HAVING SSL STATUS CHECK BUILDINGS FOR MONITORING THRESHOLD VOLTAGES OF STRING SELECTION TRANSISTORS AND METHODS FOR MONITORING AND OPERATING THE SAME

(71) Applicant: Seoul National University R&DB FOUNDATION, Seoul (KR)

(72) Inventors: Byung-Gook Park, Seoul (KR); Wandong Kim, Seoul (KR); Pil-Jong Kim, Seoul (KR); Seon-Ick Sohn, Seoul (KR)

(73) Assignee: Seoul National University R&DB FOUNDATION (KR)

( * ) Notice: Subject to any disclaimer, the term of this patent is extended or adjusted under 35 U.S.C. 154(b) by 0 days.

(21) Appl. No.: 14/185,399

(22) Filed: Feb. 20, 2014

(65) Prior Publication Data
US 2014/0233315 A1    Aug. 21, 2014

(30) Foreign Application Priority Data
Feb. 20, 2013    (KR) .......................... 10-2013-0018146

(51) Int. Cl.
*G11C 16/04* (2006.01)
*G11C 16/10* (2006.01)

(52) U.S. Cl.
CPC ............ *G11C 16/0483* (2013.01); *G11C 16/10* (2013.01)

(58) Field of Classification Search
USPC ........................ 365/185.01–185.33
See application file for complete search history.

(56) References Cited

U.S. PATENT DOCUMENTS

| | | | |
|---|---|---|---|
| 2009/0185422 A1* | 7/2009 | Kang et al. | 365/185.11 |
| 2012/0096331 A1* | 4/2012 | Shepard | 714/768 |
| 2012/0281478 A1* | 11/2012 | Lue et al. | 365/185.18 |
| 2012/0327719 A1* | 12/2012 | Lue | 365/185.23 |
| 2013/0016558 A1* | 1/2013 | Ahn et al. | 365/185.03 |
| 2013/0047132 A1* | 2/2013 | Kim et al. | 716/132 |
| 2013/0069152 A1* | 3/2013 | Lee et al. | 257/335 |
| 2013/0100743 A1* | 4/2013 | Lue | 365/185.18 |
| 2013/0114338 A1* | 5/2013 | Park et al. | 365/185.03 |
| 2013/0124783 A1* | 5/2013 | Yoon et al. | 711/103 |
| 2013/0128662 A1* | 5/2013 | Song et al. | 365/185.03 |
| 2013/0223142 A1* | 8/2013 | Park et al. | 365/184 |

FOREIGN PATENT DOCUMENTS

| | | |
|---|---|---|
| KR | 10-1036155 | 5/2011 |
| KR | 10-2011-0111166 | 10/2011 |
| KR | 10-2012-0019349 | 2/2012 |

* cited by examiner

*Primary Examiner* — Harry W Byrne
(74) *Attorney, Agent, or Firm* — Gerald E. Hespos; Michael J. Porco; Matthew T. Hespos

(57) ABSTRACT

Disclosed is a 3D stacked NAND flash memory array having SSL status check buildings for monitoring threshold voltages of string selection transistors, a monitoring method of threshold voltages of string selection transistors by the SSL status check buildings, and an operating method thereof.

17 Claims, 8 Drawing Sheets

3D STACKED NAND FLASH MEMORY ARRAY HAVING SSL STATUS CHECK BUILDINGS FOR MONITORING THRESHOLD VOLTAGES OF STRING SELECTION TRANSISTORS AND METHODS FOR MONITORING AND OPERATING THE SAME

CROSS REFERENCE TO RELATED APPLICATION

This application claims priority under 35 U.S.C. 119 of Korean Patent Application No. 10-2013-0018146 filed on Feb. 20, 2013, the entire contents of which are hereby incorporated by reference.

BACKGROUND

1. Field of the Invention

The present invention relates to a 3D stacked NAND flash memory array, and more particularly to a 3D stacked NAND flash memory array having SSL status check buildings for monitoring threshold voltages of string selection transistors, a monitoring method of threshold voltages of string selection transistors by the SSL status check buildings, and an operating method of the 3D stacked NAND flash memory array having SSL status check buildings.

2. Description of the Related Art

Recently, the utilization of flash memories as high integrity mass storage devices has been increasing, but there has been difficulty in improving the degree of integrity under 20 nm due to limitation of the photolithography technology. Thus, various NAND flash memory arrays enabling three-dimensional (3D) stack have been studied.

When the memory structure having a 3D stacked shape is compared with the conventional two-dimensional (2D) planar structure as shown in FIG. 1, the greatest difference is a necessity of a layer selection in the 3D stacked memory structure during operation.

These days, the various 3D structures enabling a layer selection in the operation of writing (a program) and reading (a read) are being studied. One example is a 3D NAND flash memory array distinguishing stacked layers from each other by electrical erases described in Korean Publication No. 10-2011-0111166.

The prior art is known as a structure performing a layer selection by erase operation (LASER). According to this structure, each SSL (LSL shown in FIG. 1 of Korean Publication No. 10-2011-0111166 is equal to SSL) and a body of an active line separately formed by each layer are used to extract electrons from a specific charge storage layer between the SSL and the body of the active line in each layer for electrically forming an erase state combination, namely an initialized state combination, instead of the impurity-doped layer combination physically formed in the conventional Korean Patent No. 10-1036155. So, it has merits that the layer selection can be more easily performed.

However, the LASER structure is needed to have the more number of SSLs in case of the more number of layers. Considering that the general width of SSL (String Selection Line), in more details, the gate length of a string selection transistor is 4-5 times larger than that of a memory cell (i.e., the width of a word line) to overcome some problems such as a leakage current, short channel effect, etc., there has been a gradually rising necessity to maximally inhibit the increasing number of required SSLs according to the increasing number of layers.

To solve the problems of the LASER structure, a 3D stacked NAND flash memory array enabling a layer selection by multi-level operation (LSM) and an operation method thereof have been developed and filed as Korean Application No. 10-2012-0019349 by the present applicant. It is possible to get rid of the waste of unnecessary areas by minimizing an increase in the number of string selection lines (SSLs) though vertically stacked layers are increased.

By the way, in order to normally operate a layer selection by SSL, the LASER structure and the 3D stacked NAND flash memory array enabling LSM need a check on threshold voltages of string selection transistors formed with SSL. For checking the threshold voltages of string selection transistors, timing sequences may be further added between the regular operations (a program, a read and an erase).

However, if extra timing sequences are added to check the threshold voltages of string selection transistors in the 3D stacked NAND flash memory array, it restricts the NAND operations used in the conventional 2D plane structure shown in FIG. 1 and finally produces loss problems in operation speed and efficiency compared to the conventional art.

SUMMARY OF THE INVENTION

The present invention is to provide a 3D stacked NAND flash memory array having SSL status check buildings for monitoring threshold voltages of string selection transistors by simultaneously checking whether the threshold voltages of string selection transistors are normal or not during a read operation without affecting to the operation timing of the conventional 2D NAND flash memory, and methods for monitoring and operating the same.

To achieve the objectives, a 3D stacked NAND flash memory array according to the present invention is comprising: a memory building block composed of one or more unit buildings, each of the unit buildings comprising a plurality of active lines formed at a regular interval in one direction, a plurality of string selection lines, a plurality of word lines and a ground selection line vertically crossing the plurality of active lines and being disposed at a regular interval in another direction, each of the active lines being formed of a plurality of semiconductor layers vertically stacked on a substrate and having one end connected to a bit line, wherein an SSL status check building is further formed at one side of the memory building block on the substrate for checking threshold voltages of string selection transistors formed with the plurality of string selection lines, the SSL status check building having the same structure as that of the unit building.

Here, the string selection transistors may be vertically stacked by each of the string selection lines and programmed to have an increasing or decreasing threshold voltage distribution by two or more different values toward the lower ones.

The vertical threshold voltage distributions of string selection transistors by the two string selection lines adjacently disposed may be reverse to each other.

Each of the unit buildings may comprise a plurality of common source lines connected to each of the semiconductor layers being protruded to one side of the ground selection line at the other end of each of the active lines, each of the semiconductor layers being horizontally connected to one another under the ground selection line.

Each of the unit buildings may further comprise a common body vertically connecting each of the semiconductor layers at the other side of the ground selection line.

The plurality of string selection lines and the ground selection line may be connected to each of output terminals equipped in a row decoder of the memory building block through one or more unit buildings of the memory building block and the SSL status check building, the plurality of word lines and common source lines may be cut off between the memory building block and the SSL status check building, the plurality of word lines and common source lines of the memory building block may be connected to each of output terminals equipped in the row decoder of the memory building block, the plurality of word lines and common ground lines of the SSL status check building may be connected to each of output terminals of a monitoring row decoder disposed at the opposite side of the row decoder of the memory building block, and each of bit lines connected to one end of each of the active lines of the SSL status check building may be connected to a bit line input terminal equipped in a monitoring page buffer.

On the other hand, in a method for monitoring threshold voltages of the string selection transistors of the 3D stacked NAND flash memory array according to the present invention, the threshold voltage monitoring of the string selection transistors may be simultaneously performed by the monitoring page buffer while operating the memory building block by applying voltages to the plurality of string selection lines for selecting a specific semiconductor layer among the plurality of semiconductor layers.

Here, each of the word lines of the SSL status check building may be applied with a pass voltage enabling to turn on a channel of each cell, a selected common source line connected to a specific semiconductor layer among the plurality of common source lines of the SSL status check building may be applied with a ground voltage and the other unselected common source lines may be applied with higher than the ground voltage, the ground selection line may be applied with a turn-on voltage enabling to turn on the channels of ground selection transistors, and the status of the threshold voltage of the string selection transistors may be checked by whether an output of the monitoring page buffer is a binary "1" as a normal or a binary "0" as an abnormal.

And in a method for operating the 3D stacked NAND flash memory array according to the present invention, a program operation of string selection transistors for correcting abnormal threshold voltage values may be performed by a selected memory building block to disperse busy status times for programming the string selection transistors in a plurality of memory building blocks.

The present invention can keep operation speed and efficiency as like as the conventional 2D NAND flash memory by simultaneously checking whether the threshold voltages of string selection transistors are normal or not during the operation of memory building blocks by SSL status check buildings having the same structure as that of an unit building in one side of each of the memory building blocks.

Furthermore, the present invention can disperse busy state times for programming all the string selection transistors in a plurality of memory building blocks by programming a selected memory building block only to correct abnormal threshold voltage values of the string selection transistors.

BRIEF DESCRIPTION OF THE DRAWINGS

In FIG. 3, the layers are drawn to be laterally laid out for explaining an operation of a layer selection.

FIG. 7 shows a case that an SSL status check building according to the present invention is not equipped but FIG. 8 shows the other case that an SSL status check building according to the present invention is equipped.

In these drawings, the following reference numbers are used throughout: reference number 10 indicates a semiconductor layer, 20 an insulating layer, 30 an active line, 40 a bit line, 50 a string selection line, 60 a word line, 70 a ground selection line, 80 a stair-shaped protrusion, 90 a common body, 100 an unit building, 200 a memory building block, 300 an SSL status check building, 400 a row decoder of a memory building block, 500 a monitoring row decoder, 600 a monitoring page buffer, and 700 a memory page buffer.

DETAILED DESCRIPTION OF THE PREFERRED EMBODIMENTS

Detailed descriptions of preferred embodiments of the present invention are provided below with accompanying drawings.

Figure 2:
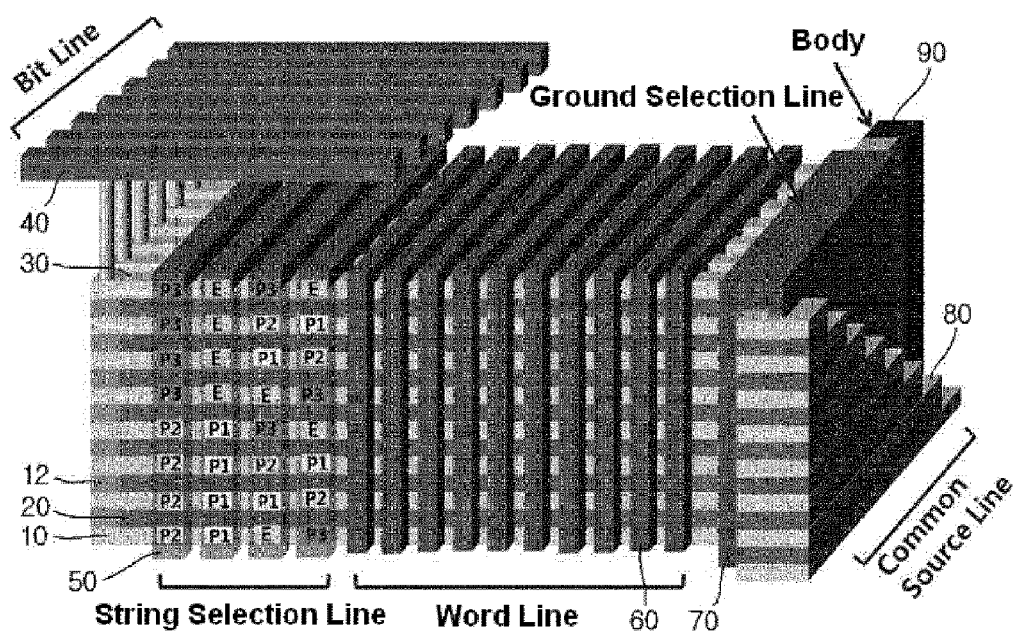
FIG. 2 is a perspective view showing a unit building structure which forms a 3D stacked NAND flash memory array according to an embodiment of the present invention.
Figure 3:
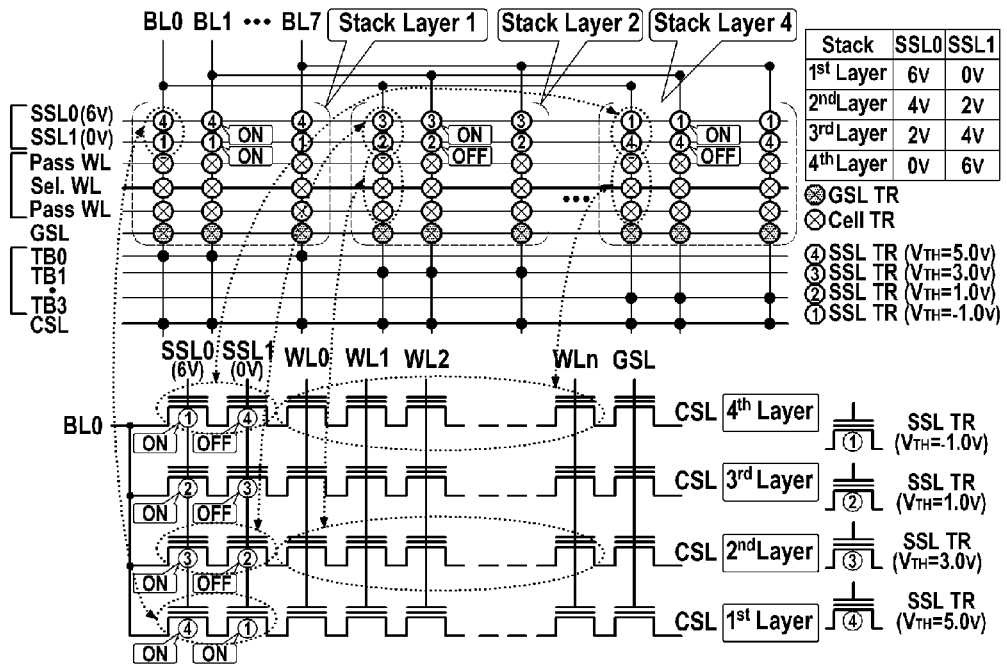
FIG. 3 is an equivalent circuit diagram conceptually showing a structure having four stacked semiconductor layers and two SSLs as an embodiment of FIG. 2.
Figure 7:
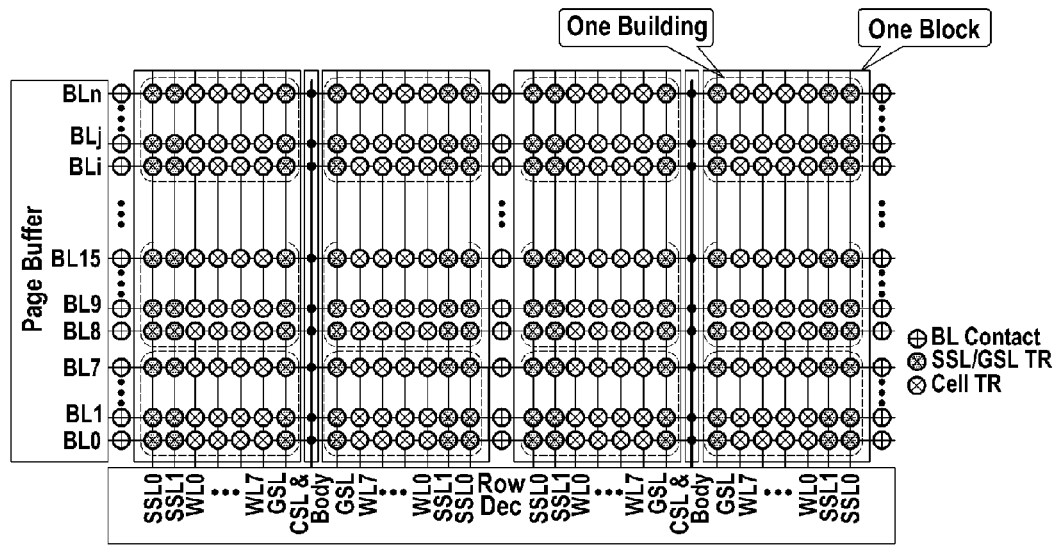
FIGS. 7 and 8 are diagrams of a 3D stacked NAND flash memory array showing an array structure of each of the layers by being laterally laid out as a folding screen is unfolded.
Figure 8:
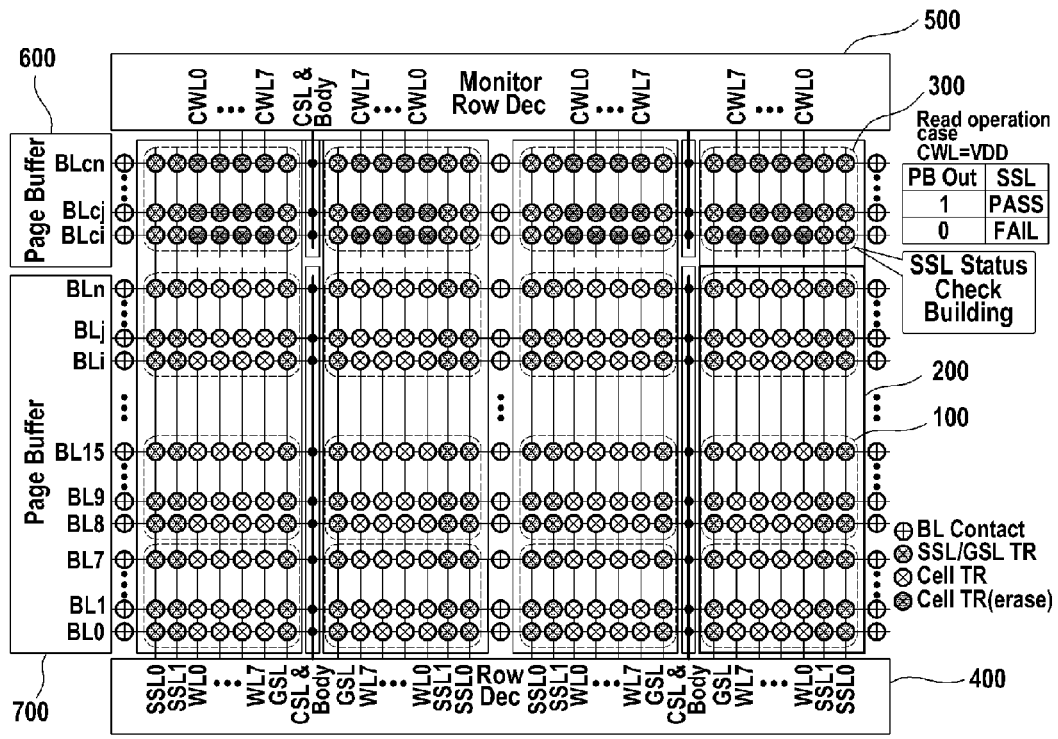

First, a 3D stacked NAND flash memory array according to an embodiment of the present invention is comprising: as shown in FIGS. 2, 7 and 8, a memory building block 200 composed of one or more unit buildings 100, each of the unit buildings 100 comprising a plurality of active lines 30 formed at a regular interval in one direction (e.g., a word line direction in FIG. 2), a plurality of string selection lines 50, a plurality of word lines 60 and a ground selection line 70 vertically crossing the plurality of active lines 30 and being disposed at a regular interval in another direction (e.g., an active line direction in FIG. 2), each of the active lines 30 being formed of a plurality of semiconductor layers 10 vertically stacked on a substrate (not shown) and having one end connected to a bit line 40, wherein an SSL status check building 300 is further formed at one side of the memory building block 200 on the substrate for checking threshold voltages of string selection transistors formed with the plurality of string selection lines 50, the SSL status check building 300 having the same structure as that of the unit building 100.

Here, each of the semiconductor layers, as shown in FIG. 2, is horizontally connected to one another electrically or as one body under the ground selection line at the other end of each of the active lines 30 in each of the unit buildings 100 and the SSL status check building 300. Namely, the plurality of active lines 30 are shaped just like a plurality of fingers vertically stacked and horizontally pasted in a palm per layer under the ground selection line 70.

And each of the active lines 30 may have a wall shape vertically stacked with the plurality of semiconductor layers 10 interlaid with an insulating layer 20 except a contact portion. One end of each of the active lines 30, as shown in FIG. 2, is connected to a bit line 40 through the contact portion. The contact portion of each of the active lines 30 connected to each of the bit lines 40 is filled a conductive material layer 12 (e.g., if each of the semiconductor layers is a silicon layer, it may be a silicon germanium layer doped with impurities) into the interlayer of the plurality of semiconductor layers 10 instead of an insulating layer 20 to electrically connect the plurality of semiconductor layers 10 vertically stacked.

Each of the string selection transistors has a predetermined charge storage layer as a memory cell formed with a word line 60. The string selection transistors, as shown in FIG. 2, are vertically stacked by each of the string selection lines 50.

And the string selection transistors, as shown in FIG. 2, may be previously programmed to have an increasing threshold voltage distribution (e.g., E, E, E, E; P1, P1, P1, P1 or E, P1, P2, P3; E, P1, P2, P3 in FIG. 2) or a increasing threshold voltage distribution (e.g., P3, P3, P3, P3; P2, P2, P2, P2 or P3, P2, P1, E; P3, P2, P1, E in FIG. 2) by two or more different values toward the lower ones along each of the string selection lines 50.

In FIG. 2, E indicates an erased status and P1, P2 and P3 are different threshold voltages having a relationship as P1<P2<P3.

Although the threshold voltage distribution of the string selection transistors can be different, it is preferable that the vertical threshold voltage distributions of string selection transistors by the two string selection lines adjacently disposed are reverse to each other as shown in FIG. 2.

When the string selection transistors have the reverse vertical threshold voltage distributions by the two string selection lines adjacently disposed as mentioned above, the 3D stacked NAND flash memory array can get rid of the waste of unnecessary regions by minimizing an increase of the number of string selection lines according to an increase of the number of vertically stacked layer such as LSM (Layer Selection by Multi-level operation). For further details on LSM, it can refer to Korean Application No. 10-2012-0019349 which is published as Korean Publication No. 10-2013-0097592.

On the other hand, each of the semiconductor layers 10 is horizontally connected to one another in the same layer under the ground selection line 70 and the semiconductor layers 10, as shown in FIG. 2, have a stair-shaped protrusion 80 at one side of the ground selection line 70. The stair-shaped protrusion 80 is connected to a plurality of common source lines (CSLs) through predetermined contact plugs for independently applying a bias to each of the semiconductor layers 10.

And a common body 90 may be further disposed at another side, namely at a different side of the ground selection line 70 to vertically connect the semiconductor layers 10 as shown in FIG. 2.

In an embodiment of the unit building 100 included in the memory building block 200, the common source lines (CSLs) and the common body 90 can be formed at the places exchanged with each other, i.e., in FIG. 2, the common source lines (CSLs) can be formed as one common source line at the place of the common body 90 and the common body 90 can be formed as a plurality of body lines at the place of the common source lines (CSLs). But it is preferable that the SSL status check building 300 has a plurality of common source lines (CSLs) connected to the stair-shaped protrusion 80 and a common body 90 vertically connected to the semiconductor layers 10 at the other side of the ground selection line 70 as the structure of the unit building 100 shown in FIG. 2.

Hereinafter, it is mainly described on an embodiment that the SSL status check building 300 has the same structure as that of the unit building 100 of the memory building block 200.

In this embodiment, the plurality of string selection lines 50 and the ground selection line 70, as shown in FIG. 8, are connected to each of output terminals equipped in a row decoder 400 of the memory building block 200 through one or more unit buildings 100 of the memory building block 200 and the SSL status check building 300, i.e., the plurality of string selection lines 50 and the ground selection line 70 are connected to each of corresponding lines in not only more than one of the unit buildings 100 of the memory building block 200, but also the SSL status check building 300 and finally connected to each of output terminals equipped in a row decoder 400 of the memory building block 200, respectively.

The plurality of word lines 60 and common source lines (CSLs) are cut off between the memory building block 200 and the SSL status check building 300 and controlled independently.

For the above mentioned control, a plurality of word lines (WL0 to WL7) and common source lines (CSLs) of the memory building block 200 are connected to each of output terminals equipped in the row decoder 400 of the memory building block 200. A plurality of word lines (CWL0 to CWL7) and common source lines (CSLs) of the SSL status check building 300 are connected to each of output terminals of a monitoring row decoder 500 disposed at the opposite side of the row decoder 400 of the memory building block 200.

And each of the bit lines 40 connected to one end of each of the active lines 30 of the SSL status check building 300 is connected to a bit line input terminal equipped in a monitoring page buffer 600.

Of course, each of the bit lines 40 connected to one end of each of the active lines 30 of the unit building 100 of the memory building block 200 is connected to a bit line input terminal equipped in a memory page buffer 700.

FIG. 8 is a diagram of an embodiment comprising a memory build block 200 and an SSL status check building 300 showing an array structure of each of the layers by being laterally laid out as a folding screen is unfolded. Of course, it is possible to dispose two or more memory building blocks 200 and an SSL status check building 300 at one side of each of the memory building blocks 200. In the latter case, each of the bit lines is shared and connected to each of the input terminals of the above mentioned monitoring and memory page buffers 600 and 700.

Next, the monitoring method of threshold voltages of the string selection transistors in the 3D stacked NAND flash memory array according to the above embodiment is described.

Figure 1:
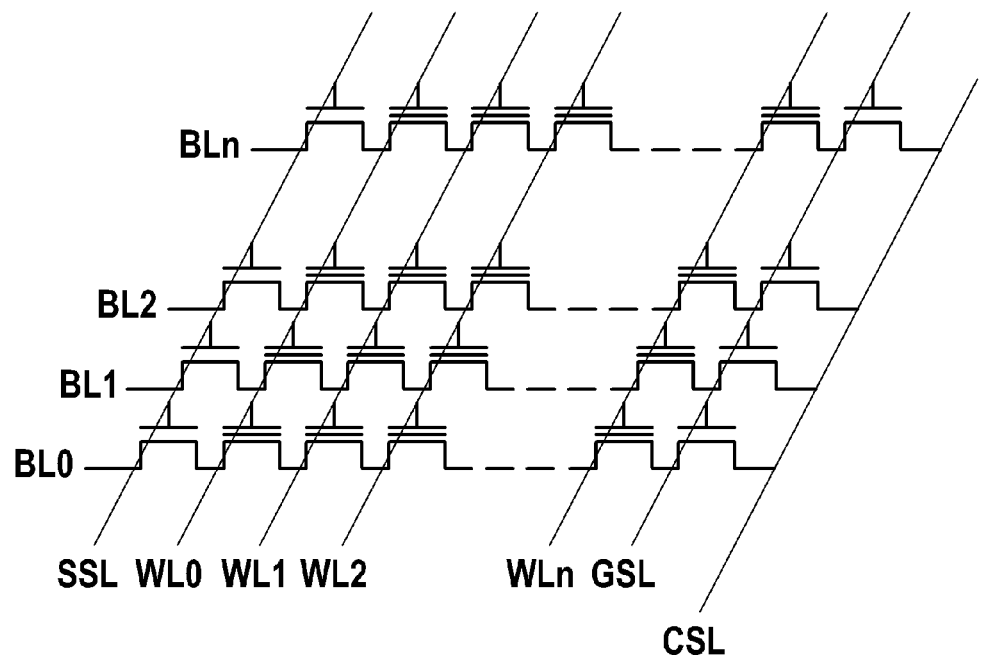
FIG. 1 is an equivalent circuit diagram of a conventional 2D NAND flash memory array.

In order to perform a read or write operation in the 3D stacked NAND flash memory array that it equals to the operation of the conventional 2D NAND flash memory array as shown in FIG. 1, all the string selection transistors of a selected layer have to be 'turn on' and at least one of the string selection transistors of the other unselected layers have to be 'turn off'.

Figure 4:
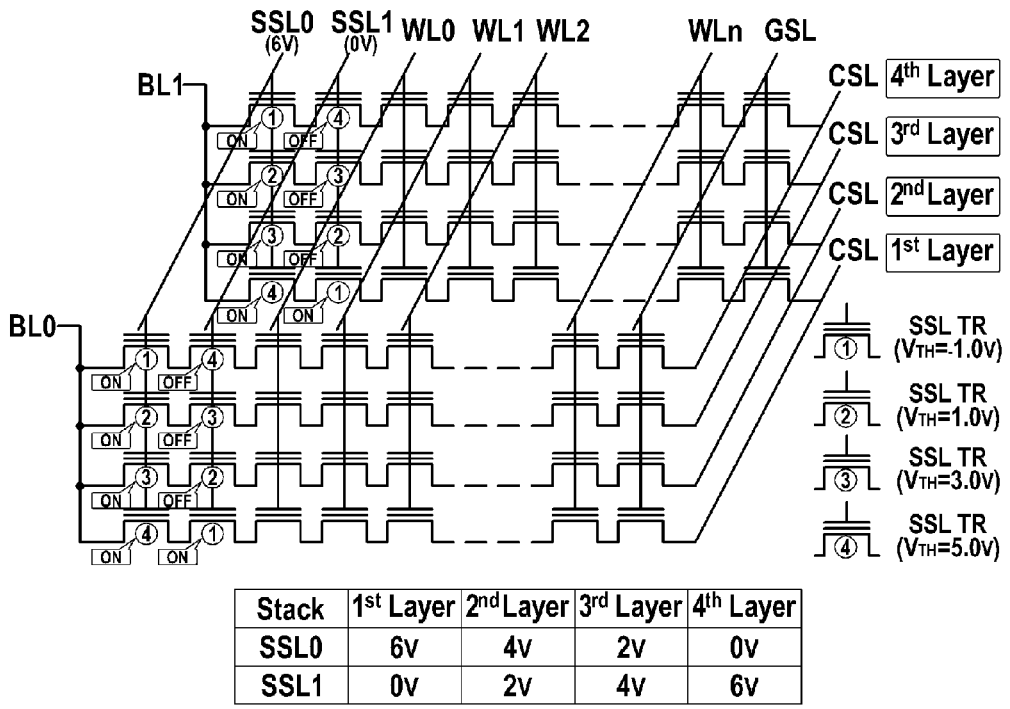
FIG. 4 is an equivalent circuit diagram of a 3D stacked NAND flash memory array showing that each of bit lines is connected to two active lines, respectively, in FIG. 3 and an exemplary bias-applying table of the string selection lines for a layer selection.

FIG. 4 is a diagram showing an example of the first semiconductor layer (1st layer) selection among four stacked semiconductor layers.

For enabling LSM, the string selection transistors formed along SSL0 are programmed to have threshold voltages −1.0V, 1.0V, 3.0V and 5.0V going down to the lower layer and the string selection transistors formed along an adjacent SSL1 are reversely programmed to have threshold voltages decreasing toward the lower ones.

For selecting the first semiconductor layer (1st layer) by the string selection transistors previous programmed as mentioned above, as shown in FIG. 4, when SSL0 and SSL1 are applied with 6V and 0V, respectively, all the string selection transistors in the first semiconductor layer (1st layer) are turned on and at least one of all the string selection transistors in the other layers is turned off. So it enables to select only the first semiconductor layer (1st layer).

For selecting the other layers, each of the string selection lines may be applied with bias voltages of the bias applying table shown in FIG. 4.

Figure 5:
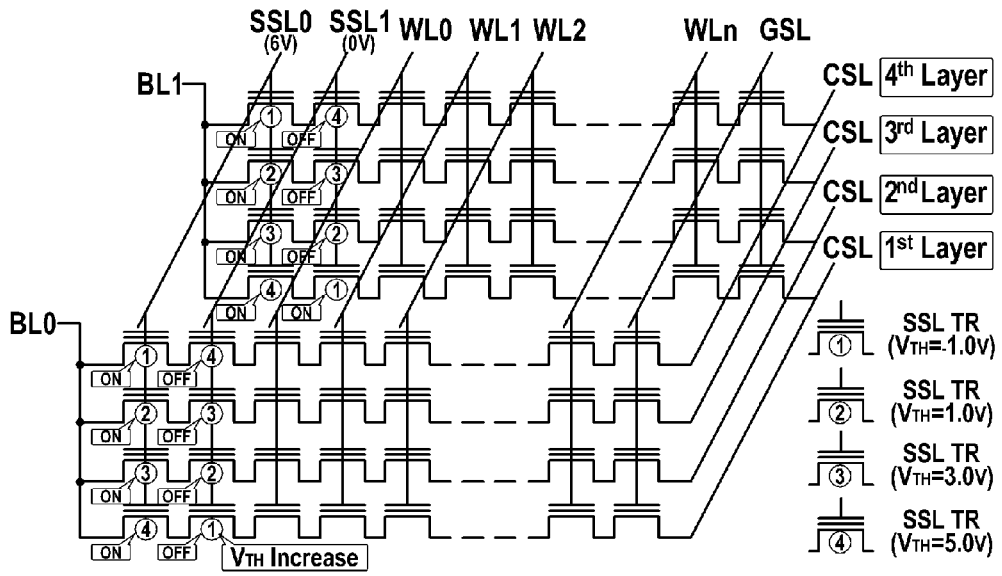
FIG. 5 is an equivalent circuit diagram of a 3D stacked NAND flash memory array showing failure of a layer selection due to a threshold voltage increase of one of string selection transistors in FIG. 4.
Figure 6:
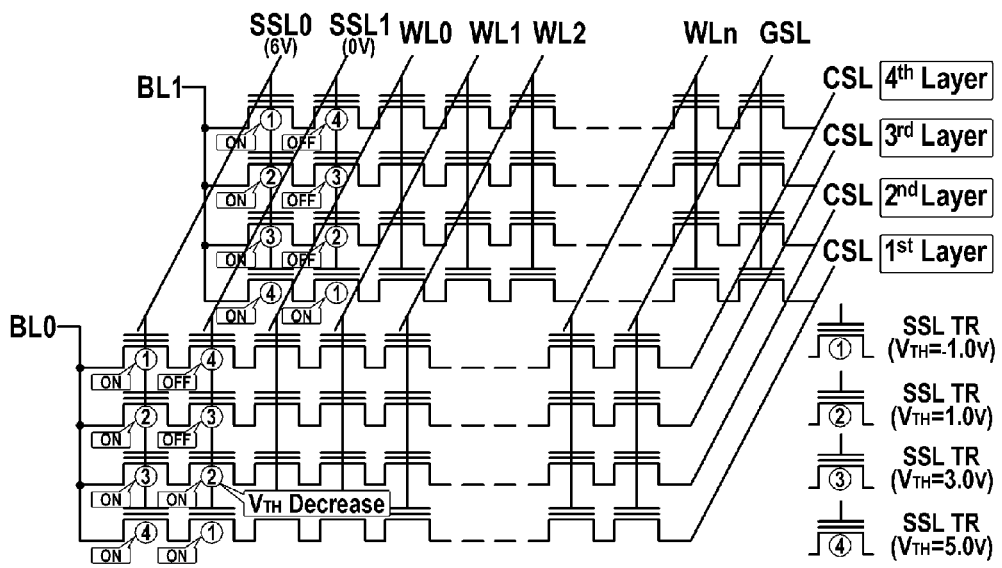
FIG. 6 is an equivalent circuit diagram of a 3D stacked NAND flash memory array showing failure of a layer selection due to a threshold voltage decrease of one of string selection transistors in FIG. 4.

However, when the threshold voltages of the previously programmed string selection transistors are increased or decreased as shown in FIGS. 5 and 6, respectively, there is a problem that it cannot properly perform the layer selection.

In other words, in the example as shown in FIG. 4, if the threshold voltage value of a string selection transistor located at the bottom among the string selection transistors formed with SSL1 on the active line connected to BL0, as shown in FIG. 5, is increased from the previously programmed value, the bottom string selection transistor is turned off when bias voltages to select the first semiconductor layer are applied to the string selection lines SSL0 and SSL1. So there is a problem that it cannot select a specific layer.

Reversely, in the example as shown in FIG. 4, if the threshold voltage value of a string selection transistor located at the second layer from the bottom among the string selection transistors formed with SSL1 on the active line connected to BL0, as shown in FIG. 6, is decreased from the previously programmed value, all the string selection transistors of the first and second semiconductor layers of the active line connected to BL0 are turned on when bias voltages to select the first semiconductor layer are applied to the string selection lines SSL0 and SSL1. And there is also a problem that it cannot select a specific layer.

As mentioned above, in operation of the 3D stacked NAND flash memory array, especially in operation of the 3D stacked NAND flash memory array enabling LSM, the check of threshold voltages of the string selection transistors is very important.

For this check, in the present embodiment, as mentioned above, the SSL status check building is equipped at one side of the memory building block. It is possible to simultaneously check whether the threshold voltages of the string selection transistors are normal or not through the monitoring page buffer 600 of the SSL status check building when the memory building block is operated, particularly in a read operation, by applying the voltages to the plurality of string selection lines for selecting a specific semiconductor layer among the plurality of semiconductor layers.

Figure 9:
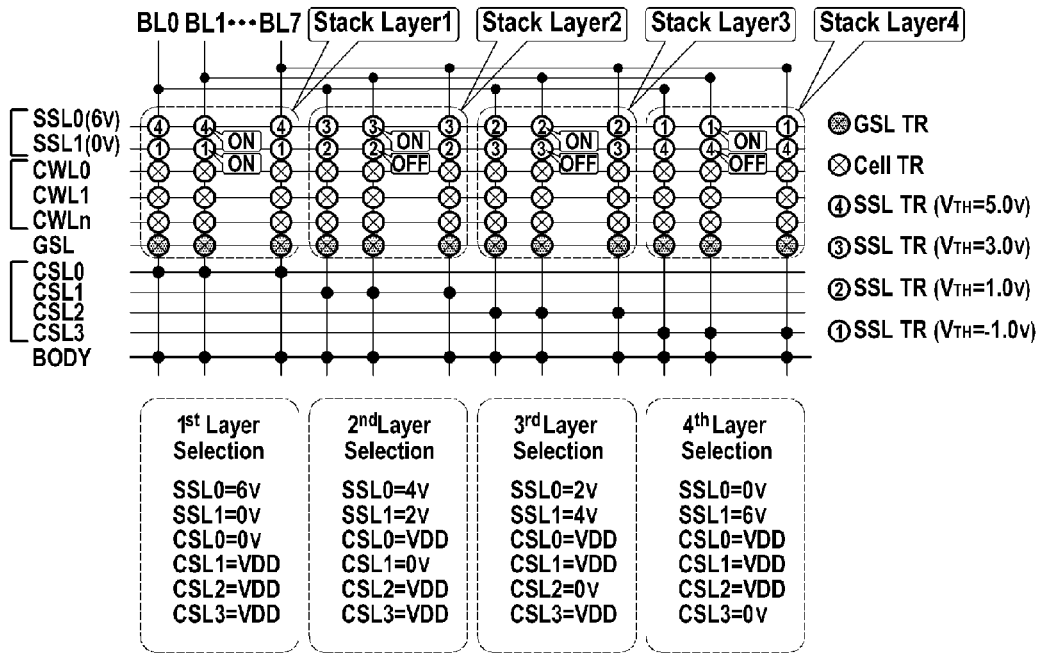
FIGS. 9 to 12 are array diagrams of SSL status check buildings showing a monitoring method to check whether the threshold voltages of string selection transistors are normal or not by SSL status check buildings in the structure having four stacked semiconductor layers and two SSLs as shown in FIG. 3.
Figure 10:
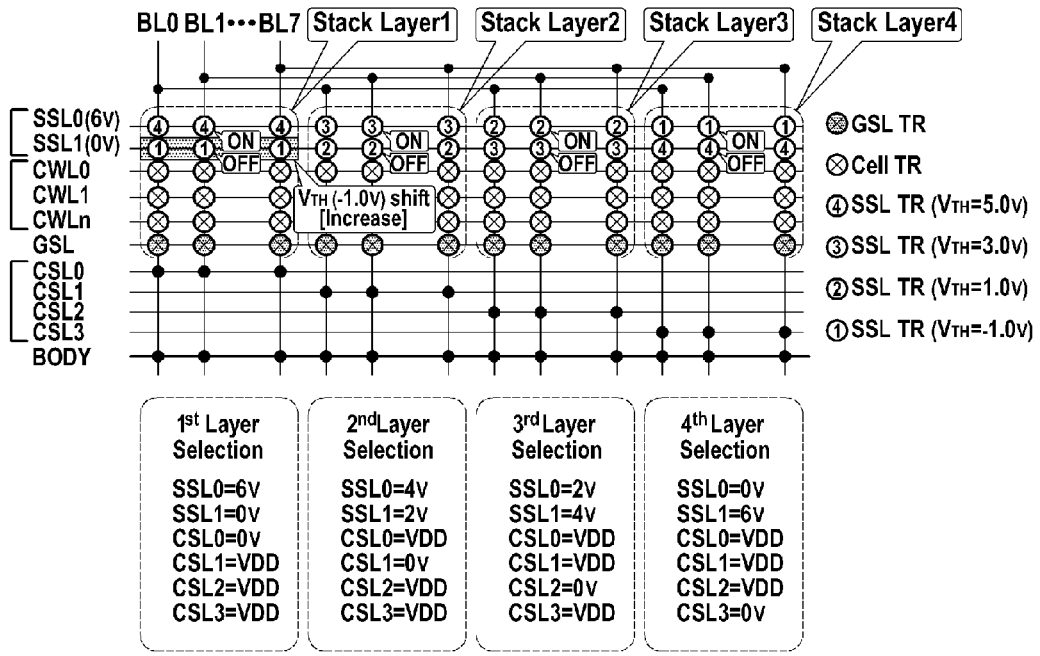
Figure 11:
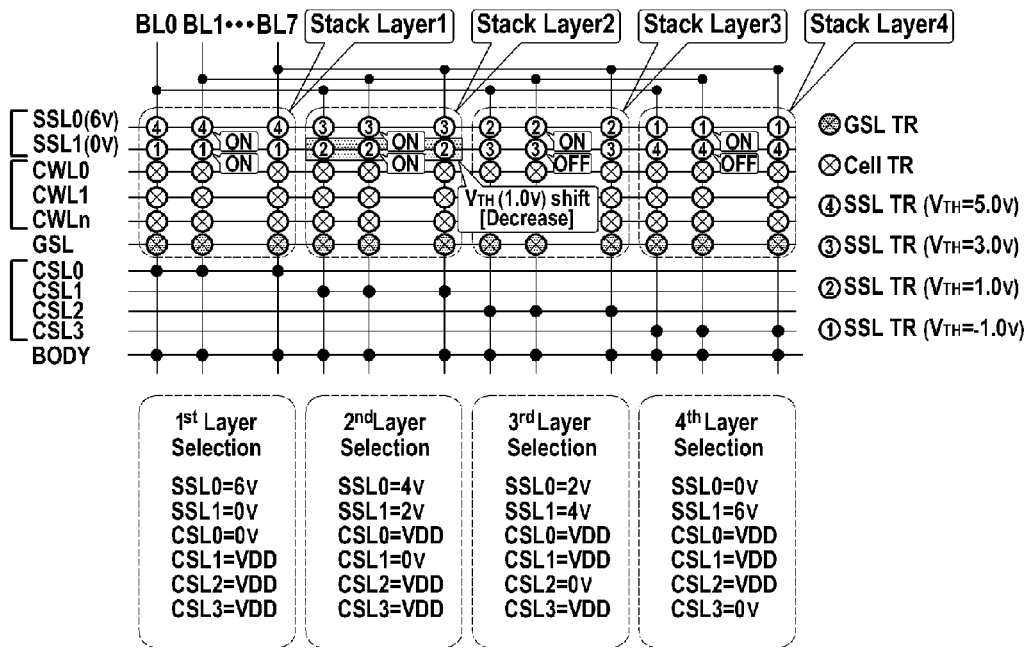

In more detailed embodiment, as shown in FIGS. 9 to 11, when the plurality of word lines CWL0 to CWL7 of the SSL status check building 300 are applied with the pass voltage (e.g., VDD) turning on the channel of each cell, the selected common source line connected to the specific semiconductor layer among the plurality of common source lines CSL0, CSL1, CSL2 and CSL3 of the SSL status check building 300 is applied with the ground voltage, the other unselected common source lines are applied with the higher voltage (e.g., VDD) than the ground voltage and the ground selection line GSL is applied with the turn-on voltage turning on the channels of ground select transistors, the status of threshold voltages of the string selection transistors is checked by the output of the monitoring page buffer 600 as a binary "1" indicates a normal state and a binary "0" an abnormal or failure.

Figure 13:
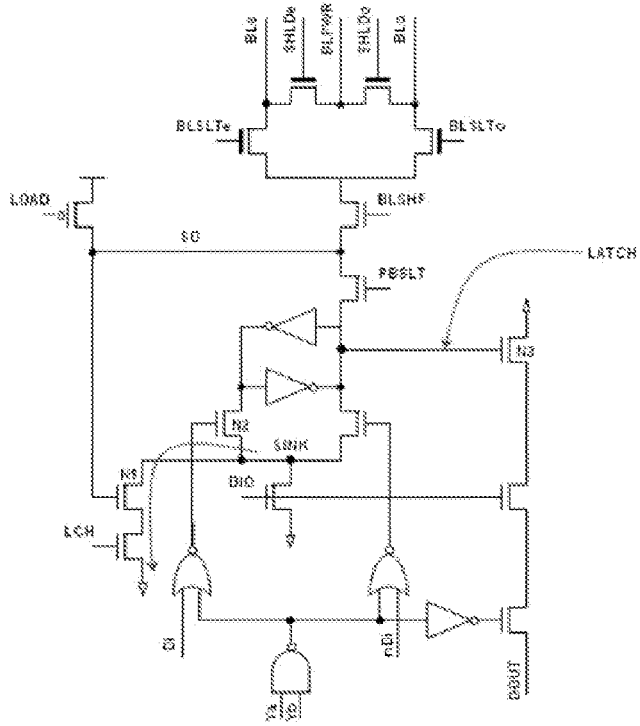
FIG. 13 is a circuit diagram of a monitoring page buffer.

Namely, as shown in FIG. 9, in case of a normal operation, a conduction path is only formed in the expected first semiconductor layer, so the ground voltage of common source line CSL0 transfer to the input terminal of the monitoring page buff 600 through the conduction path of the first semiconductor layer as a selected layer. As a result, the pre-charged value of the bit line became 0V and the output terminal (Dout) of the monitoring page buff 600, as shown in FIG. 13, has a value of a binary "1".

Therefore, in a read operation of the memory building block, by simultaneously monitoring the output of the monitoring pager buffer 600, if the binary value of the output terminal (Dout) is "1", it can be known that the status of threshold voltages of the string selection transistors is normal.

On the other hand, as shown in FIG. 10, if the layer selection is not performed due to an increase of the threshold voltage values of the string selection transistors, a conduction path is not formed in the selected layer, and the ground voltage of a common source line (e.g., CSL0) connected to the selected layer is not transferred to the input terminal of the monitoring page buff 600. So the input terminal of the monitoring page buff 600 is keeping the pre-charged value of the bit line. As a result, the output terminal (Dout) of the monitoring page buffer 600, as shown in FIG. 13, has a value of a binary "0".

And, as shown in FIG. 11, if the layer selection is not performed due to a decrease of the threshold voltage values of the string selection transistors, a conduction path is also formed in the unselected layer, and the higher voltage (e.g., VDD) than the ground voltage of a common source line (e.g., CSL1) connected to the unselected layer is transferred to the input terminal of the monitoring page buff 600. So the voltage of the input terminal of the monitoring page buff 600 connected to the bit lines (BLe) is not enough decreased, but is increased to VDD. As a result, the output terminal (Dout) of the monitoring page buffer 600, as shown in FIG. 13, has a value of a binary "0".

Figure 12:
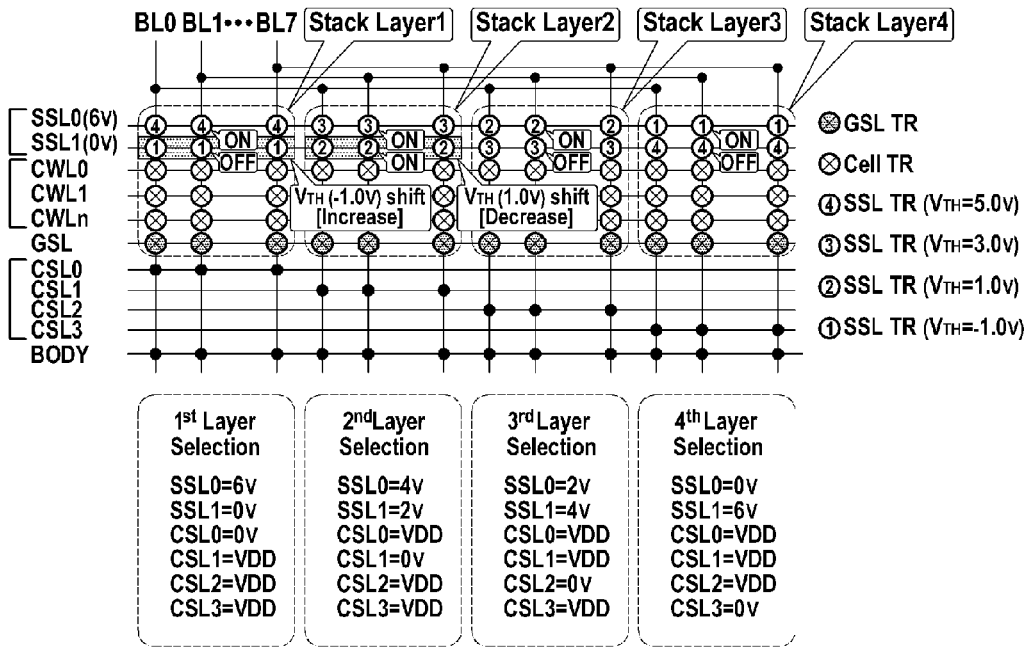

And, as shown in FIG. 12, if the layer selection is not performed due to a decrease and an increase of the threshold voltage values of the string selection transistors, a conduction path is not formed in the selected layer and the ground voltage of a common source line (e.g., CSL0) connected to the selected layer is not transferred to the bit line, but in the unselective layer a conduction path is formed and the higher voltage (e.g., VDD) than the ground voltage of a common source line (e.g., CSL1) connected to the unselected layer is transferred to the bit line to increase the voltage of the bit line to VDD. So the voltage of the input terminal of the monitoring page buff 600 connected to the bit lines (BLe) is not enough decreased, but is also increased to VDD. As a result, the output terminal (Dout) of the monitoring page buffer 600, as shown in FIG. 13, has a value of a binary "0".

Therefore, in a read operation of the memory building block, by simultaneously monitoring the output of the monitoring pager buffer 600, if the binary value of the output terminal (Dout) is "0", it can be known that the status of threshold voltages of the string selection transistors is abnormal, i.e., the string selection transistors are not keeping the previously programmed values.

As mentioned above, by further disposing an SSL status check building 300 having the same structure as that of an unit building 100 at one side of each memory building block 200, the 3D staked NAND flash memory array can keep operation speed and efficiency as like as the conventional 2D NAND flash memory by simultaneously checking whether the threshold voltages of string selection transistors are normal or not during the operation of memory building blocks by SSL status check buildings.

FIG. 13 is a circuit diagram of a monitoring page buffer 600 and the operating principle of the circuit is briefly described below.

In a read operation, when node LATCH is pre-charged to a binary "0" and transistors BLSLTe and BLSHF are turned on, the voltage of node SO pre-charged to VDD changes according to the voltage of BLe. If the voltage of node SO is higher than the value of threshold voltage of transistor N1 (e.g., in case that the voltage of BLe is kept the pre-charged value), during a sensing operation performed by a signal of LCH, the voltage of node SINK is decreased to the ground value, through transistor N2, the node LATCH is changed to VDD to turn on transistor N3, and Dout is a binary "0".

Figure 14:
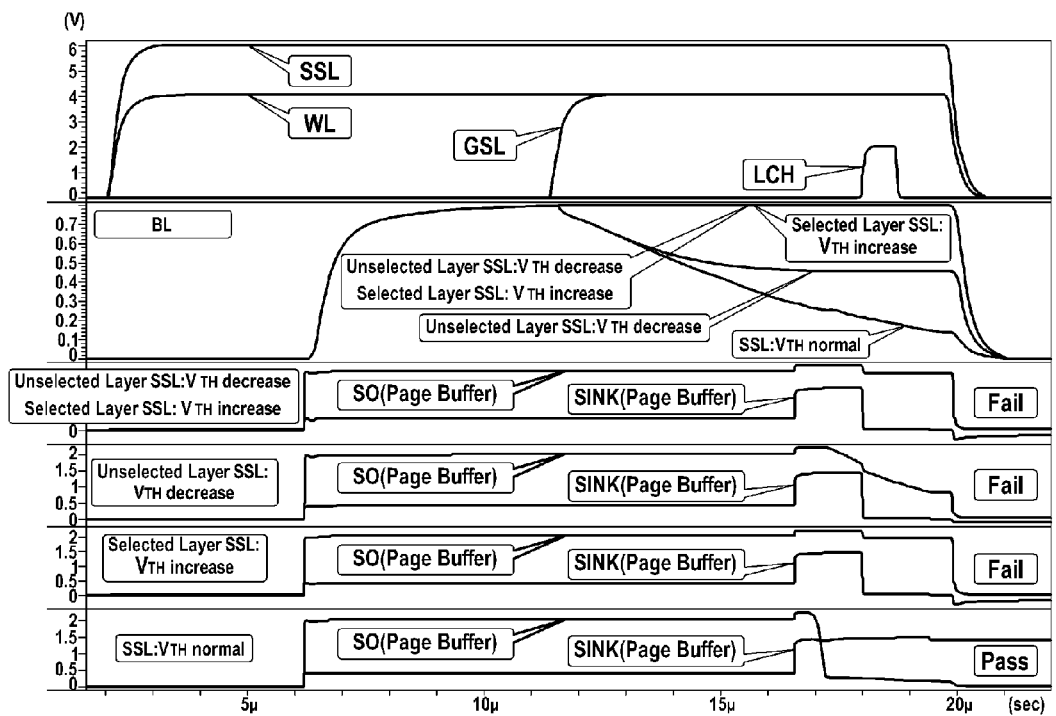
FIG. 14 is a simulation result diagram showing output waveforms of monitoring page buffers of the present invention.

FIG. 14 is a simulation result diagram showing output waveforms of the monitoring page buffer 600. The result waveforms of BL and nodes SO and SINK mentioned above regarding FIG. 13 are shown.

Figure 15:
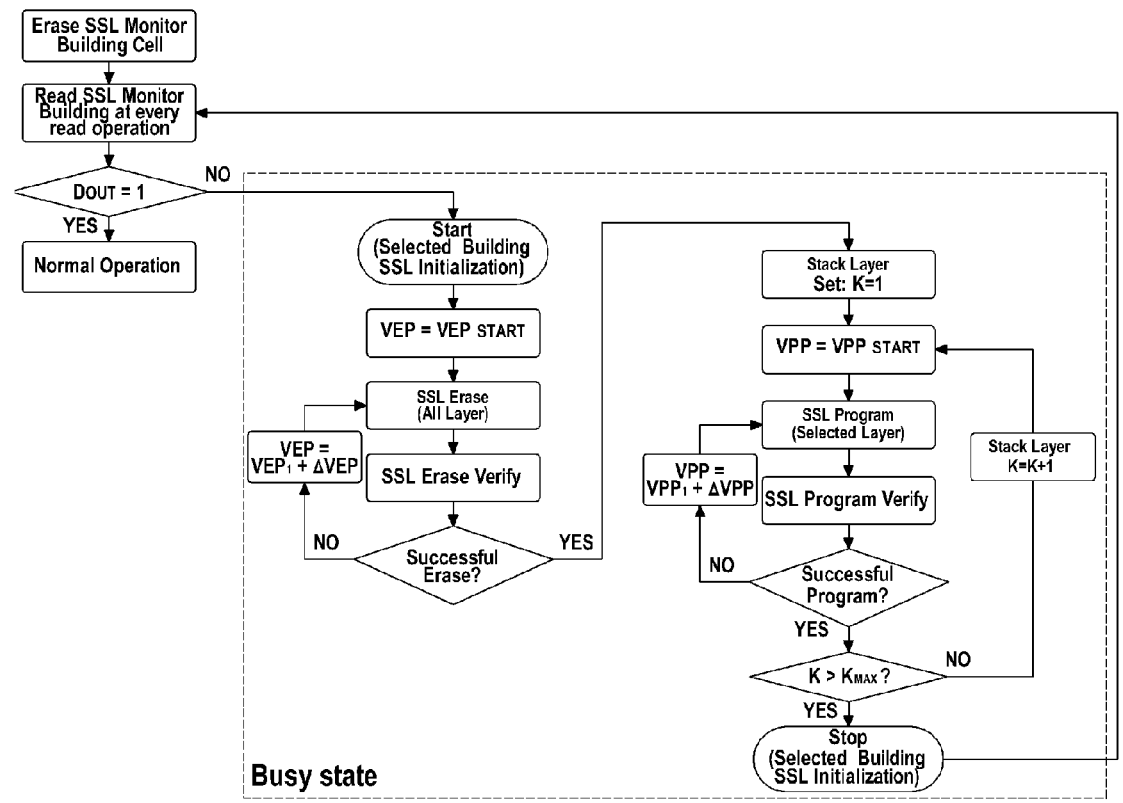
FIG. 15 is a flow chart showing an example of a reset operation of threshold voltages of string selection transistors connected to string selection lines of the related memory building block in a failure case after checking whether the threshold voltages of string selection transistors are normal or not by monitoring output waveforms of the monitoring page buffer during a read operation of a memory building block by an SSL status check building of the present invention.

FIG. 15 is a flow chart showing an example of a reset operation of threshold voltages of string selection transistors connected to string selection lines of the related memory building block in a failure case after checking whether the threshold voltages of string selection transistors are normal or not by monitoring output waveforms of the monitoring page buffer during a read operation of a memory building block by an SSL status check building of the present invention.

Therefore, in the case of the above mentioned embodiment, it is possible to disperse busy state times for programming all the string selection transistors in a plurality of memory building blocks by programming a selected memory building block only to correct abnormal threshold voltage values of the string selection transistors.

What is claimed is:
1. A 3D stacked NAND flash memory array comprising:
a memory building block composed of one or more unit buildings, each of the unit buildings comprising a plurality of active lines formed at a regular interval in one direction, a plurality of string selection lines, a plurality of word lines and a ground selection line vertically crossing the plurality of active lines and being disposed at a regular interval in another direction, each of the active lines being formed of a plurality of semiconductor layers vertically stacked on a substrate and having one end connected to a bit line,
wherein an SSL status check building is further formed at one side of the memory building block on the substrate for checking threshold voltages of string selection transistors formed with the plurality of string selection lines, the SSL status check building having the same structure as that of the unit building.

2. The 3D stacked NAND flash memory array of claim 1, wherein the string selection transistors are vertically stacked by each of the string selection lines and programmed to have an increasing or decreasing threshold voltage distribution by two or more different values toward the lower ones.

3. The 3D stacked NAND flash memory array of claim 2, wherein the vertical threshold voltage distributions of string selection transistors by the two string selection lines adjacently disposed are reverse to each other.

4. The 3D stacked NAND flash memory array of claim 1, wherein each of the unit buildings comprises a plurality of common source lines connected to each of the semiconductor layers being protruded to one side of the ground selection line at the other end of each of the active lines, each of the semiconductor layers being horizontally connected to one another under the ground selection line.

5. The 3D stacked NAND flash memory array of claim 4, wherein each of the unit buildings further comprises a common body vertically connecting each of the semiconductor layers at the other side of the ground selection line.

6. The 3D stacked NAND flash memory array of claim 4, wherein the plurality of string selection lines and the ground selection line are connected to each of output terminals equipped in a row decoder of the memory building block through one or more unit buildings of the memory building block and the SSL status check building,
the plurality of word lines and common source lines are cut off between the memory building block and the SSL status check building,
the plurality of word lines and common source lines of the memory building block are connected to each of output terminals equipped in the row decoder of the memory building block,
the plurality of word lines and common ground lines of the SSL status check building are connected to each of output terminals of a monitoring row decoder disposed at the opposite side of the row decoder of the memory building block, and
each of bit lines connected to one end of each of the active lines of the SSL status check building is connected to a bit line input terminal equipped in a monitoring page buffer.

7. The 3D stacked NAND flash memory array of claim 2, wherein each of the unit buildings comprises a plurality of common source lines connected to each of the semiconductor layers being protruded to one side of the ground selection line at the other end of each of the active lines, each of the semiconductor layers being horizontally connected to one another under the ground selection line.

8. The 3D stacked NAND flash memory array of claim 7, wherein each of the unit buildings further comprises a common body vertically connecting each of the semiconductor layers at the other side of the ground selection line.

9. The 3D stacked NAND flash memory array of claim 7, wherein the plurality of string selection lines and the ground selection line are connected to each of output terminals equipped in a row decoder of the memory building block through one or more unit buildings of the memory building block and the SSL status check building,
the plurality of word lines and common source lines are cut off between the memory building block and the SSL status check building, the plurality of word lines and common source lines of the memory building block are connected to each of output terminals equipped in the row decoder of the memory building block, the plurality of word lines and common ground lines of the SSL status check building are connected to each of output terminals of a monitoring row decoder disposed at the opposite side of the row decoder of the memory building block, and each of bit lines connected to one end of each of the active lines of the SSL status check building is connected to a bit line input terminal equipped in a monitoring page buffer.

10. The 3D stacked NAND flash memory array of claim 3, wherein each of the unit buildings comprises a plurality of common source lines connected to each of the semiconductor layers being protruded to one side of the ground selection line at the other end of each of the active lines, each of the semiconductor layers being horizontally connected to one another under the ground selection line.

11. The 3D stacked NAND flash memory array of claim 10, wherein each of the unit buildings further comprises a common body vertically connecting each of the semiconductor layers at the other side of the ground selection line.

12. The 3D stacked NAND flash memory array of claim 10, wherein the plurality of string selection lines and the ground selection line are connected to each of output terminals equipped in a row decoder of the memory building block through one or more unit buildings of the memory building block and the SSL status check building, the plurality of word lines and common source lines are cut off between the memory building block and the SSL status check building, the plurality of word lines and common source lines of the memory building block are connected to each of output terminals equipped in the row decoder of the memory building block, the plurality of word lines and common ground lines of the SSL status check building are connected to each of output terminals of a monitoring row decoder disposed at the opposite side of the row decoder of the memory building block, and each of bit lines connected to one end of each of the active lines of the SSL status check building is connected to a bit line input terminal equipped in a monitoring page buffer.

13. A method for monitoring threshold voltages of the string selection transistors of the 3D stacked NAND flash memory array of claim 6, wherein the threshold voltage monitoring of the string selection transistors is simultaneously performed by the monitoring page buffer while operating the memory building block by applying voltages to the plurality of string selection lines for selecting a specific semiconductor layer among the plurality of semiconductor layers.

14. The method of claim 13, wherein each of the word lines of the SSL status check building is applied with a pass voltage enabling to turn on a channel of each cell, a selected common source line connected to a specific semiconductor layer among the plurality of common source lines of the SSL status check building is applied with a ground voltage and the other unselected common source lines are applied with higher than the ground voltage, the ground selection line is applied with a turn-on voltage enabling to turn on the channels of ground selection transistors, and the status of the threshold voltage of the string selection transistors is checked by whether an output of the monitoring page buffer is a binary "1" as a normal or a binary "0" as an abnormal.

15. A method for operating the 3D stacked NAND flash memory array according to claim 1, wherein a program operation of string selection transistors for correcting abnormal threshold voltage values is performed by a selected memory building block to disperse busy status times for programming the string selection transistors in a plurality of memory building blocks.

16. A method for operating the 3D stacked NAND flash memory array according to claim 2, wherein a program operation of string selection transistors for correcting abnormal threshold voltage values is performed by a selected memory building block to disperse busy status times for programming the string selection transistors in a plurality of memory building blocks.

17. A method for operating the 3D stacked NAND flash memory array according to claim 3, wherein a program operation of string selection transistors for correcting abnormal threshold voltage values is performed by a selected memory building block to disperse busy status times for programming the string selection transistors in a plurality of memory building blocks.

* * * * *